(12) United States Patent
Cheng

(10) Patent No.: US 7,440,278 B2
(45) Date of Patent: Oct. 21, 2008

(54) WATER-COOLING HEAT DISSIPATOR

(75) Inventor: Chia-Chun Cheng, Chung-Ho (TW)

(73) Assignee: Cooler Master Co., Ltd., Taipei Hsien (TW)

( * ) Notice: Subject to any disclaimer, the term of this patent is extended or adjusted under 35 U.S.C. 154(b) by 300 days.

(21) Appl. No.: 11/399,333

(22) Filed: Apr. 7, 2006

(65) Prior Publication Data
US 2006/0262505 A1 Nov. 23, 2006

(30) Foreign Application Priority Data
May 19, 2005 (TW) ................ 94208120 U

(51) Int. Cl.
H05K 7/20 (2006.01)
F28D 15/00 (2006.01)
H05K 1/00 (2006.01)
H01L 23/34 (2006.01)

(52) U.S. Cl. ........... 361/699; 165/104.33; 165/80.4; 165/80.5; 174/15.1; 174/252; 257/714

(58) Field of Classification Search ......... 361/699, 361/700; 165/104.33, 80.4, 80.5; 174/15.1, 174/252; 257/714
See application file for complete search history.

(56) References Cited

U.S. PATENT DOCUMENTS

| | | | | |
|---|---|---|---|---|
| 4,204,246 A * | 5/1980 | Arii et al. | ............ | 361/699 |
| 6,352,103 B1 * | 3/2002 | Chu et al. | ............ | 165/80.3 |
| 6,400,565 B1 * | 6/2002 | Shabbir et al. | ............ | 361/687 |
| 6,787,895 B1 * | 9/2004 | Jarcy et al. | ............ | 257/698 |
| 7,342,788 B2 * | 3/2008 | Nikfar | ............ | 361/700 |
| 2005/0088822 A1 * | 4/2005 | Oberlin et al. | ............ | 361/700 |
| 2005/0135063 A1 * | 6/2005 | Heesen | ............ | 361/700 |
| 2007/0236885 A1 * | 10/2007 | Zhao et al. | ............ | 361/700 |

FOREIGN PATENT DOCUMENTS

TW 093208254 5/2004

* cited by examiner

Primary Examiner—Jayprakash N Gandhi
Assistant Examiner—Zachary M Pape

(57) ABSTRACT

A water-cooling heat dissipator mounted on an electronic heat-generating element includes a water-cooling head member and at least one heat pipe. The water-cooling head member includes a first cover and a second cover connected to the first cover. Both ends of the first cover and the second cover are formed with a receiving portion corresponding to each other, respectively. The receiving portions are adapted to be connected to the conduit connectors. A channel portion is formed between the first cover and the second cover for receiving one end of the heat pipe. With the above arrangement, the present invention can perform the heat dissipations of different heat-generating elements simultaneously to make the heat-generating elements operate under acceptable working temperatures. Further, the present invention can be widely used in the heat dissipation of compact electronic products.

13 Claims, 6 Drawing Sheets

US 7,440,278 B2

WATER-COOLING HEAT DISSIPATOR

BACKGROUND OF THE INVENTION

1. Field of the Invention

The present invention relates to an improved structure of a water-cooling heat dissipator, which can be applied to electronic heat-generating elements, and perform the heat dissipations of different heat-generating elements simultaneously to make the heat-generating elements operate under acceptable working temperatures. Also, the present invention can be widely used in the heat dissipation of compact electronic products.

2. Description of Prior Art

Conventionally, since the operating speed of the central processing unit (CPU), chip sets and peripheral electronic elements in a computer is slow, an air-cooling heat dissipator consisted of heat sinks and heat-dissipating fans is sufficient for dissipating the heat. However, in recent years, since the time clock continuously increases and the time clock is proportional to the heat, the above heat dissipator is restricted by the space of a housing and thus is gradually insufficient for dissipating the heat when the operating speed of the CPU and the chip sets is increasing. Moreover, when the heat-dissipating fans rotate in high speed, they will produce undesired noise and consume great amount of electricity. Such an issue is very important and necessary to be solved in the electronic industry. Therefore, as an alternative solution, a water-cooling heat dissipator having excellent heat-dissipating effect and low noise is provided.

A conventional structure of water-cooling heat dissipator, as disclosed in Taiwan Patent Application No. 93208254, comprises a sealed water cover, a base and a heat pillar body. The interior of the sealed water cover is provided with an accommodating space for fling with the cooling water. The top face of the sealed water cover is provided with a water-injecting screw hole and a water draining screw hole threadedly connected to a water-injecting conduit connector and a water-draining conduit connector, respectively. The water-injecting conduit connector and the water-draining conduit connector are connected to a conduit in communication with the cooling water and formed with a folded edge at the lower end of the sealed water cover. The center of the base is provided with a big through hole to be cooperatively inserted by the heat pillar body. As a result, a structure of water-cooling heat dissipator is configured to perform the heat dissipation of the CPU of the computer, so that the CPU can continuously operate under a stable state.

However, the conventional structure of water-cooling heat dissipator still has some problems. Since the sealed water cover and the heat pillar body are vertically provided, when mounted on a circuit board, they will occupy most of the available space to produce a bulky overall volume, departing from the requirements for compact electronic products, that is lightweight, thin, short and small. Further, since the water-injecting conduit connector and the water-draining conduit connector are threadedly connected to the top face of the sealed water cover, the procedures of manufacturing and assembling are complicated, so that the total working hours are longer and the cost cannot be efficiently reduced. Further, since the water-injecting conduit connector and the water-draining conduit connector project beyond the inner wall surface of the sealed water cover to obtain the sufficient fixing, bubbles will be produced at the outer periphery of the conduit connectors to cause the liquid to temporarily stay, which greatly reduces the flowing speed of the liquid and the heat carried by the liquid. Further, such conventional water-cooling heat dissipator can only perform the heat dissipation of single electronic heat-generating element, so that the practicability and the economical benefit are reduced.

SUMMARY OF THE INVENTION

The present invention is to provide an improved structure of water-cooling heat dissipator capable of performing the heat dissipations of different heat-generating elements simultaneously to make the heat-generating elements operate under acceptable working temperatures. Further, the present invention can be widely used in the heat dissipation of compact electronic products.

the present invention provides an improved structure of water-cooling heat dissipator mounted on an electronic heat-generating element, which comprises a water-cooling head member and at least one heat pipe. The water-cooling head member comprises a first cover and a second cover connected to the first cover. Both ends of the first cover and the second cover are formed with a receiving portion corresponding to each other, respectively. The receiving portions are adapted to be connected to the conduit connectors. A channel portion is formed between the first cover and the second cover for receiving one end of the heat pipe.

DETAILED DESCRIPTION OF THE INVENTION

The characteristics and the technical contents of the present invention will be explained with reference to the detailed description and the accompanying drawings.. However, it should be understood that the drawings are illustrative but not used to limit the scope of the present invention.

Figure 1:
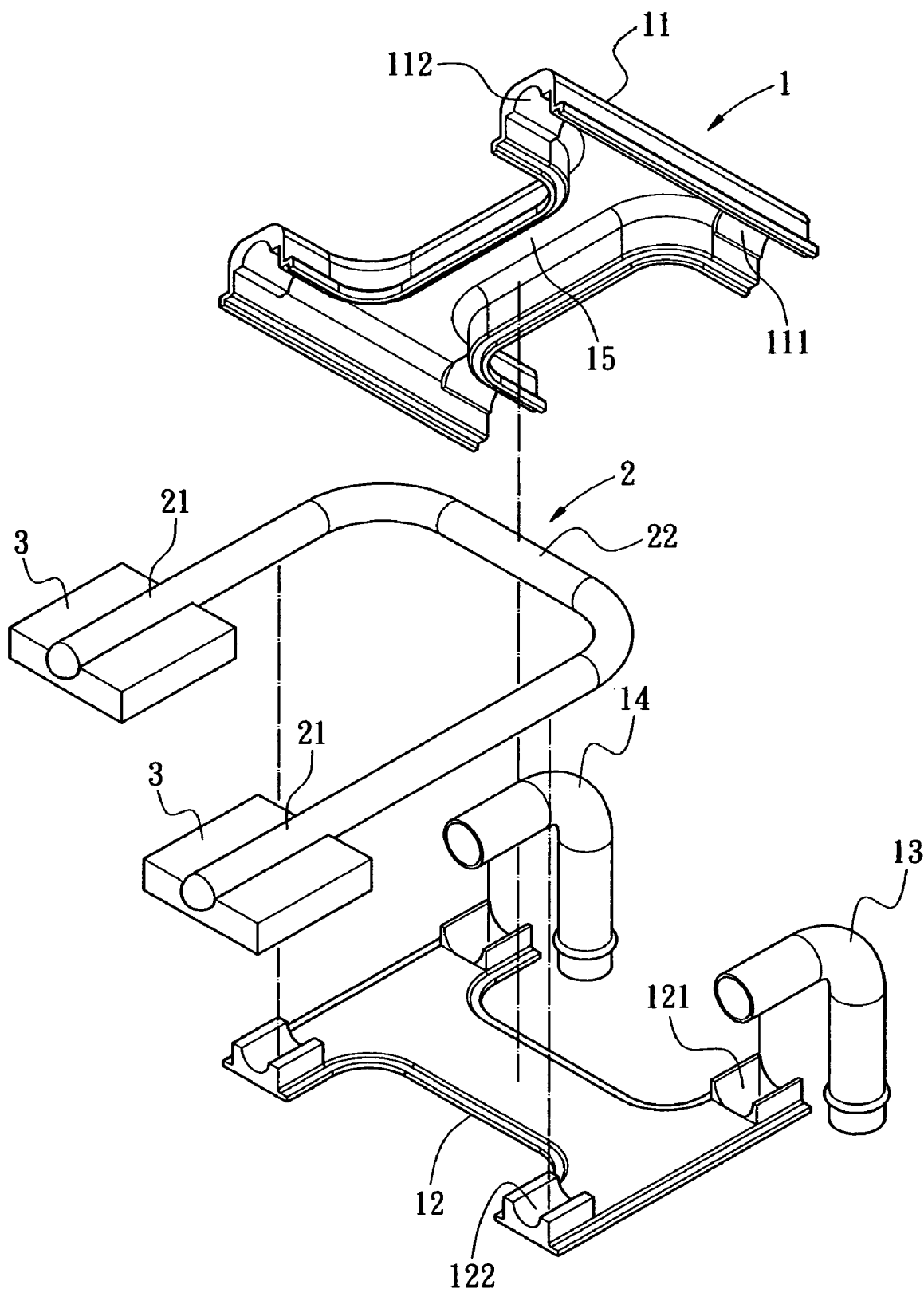
FIG. 1 is an exploded perspective view of the present invention.
Figure 2:
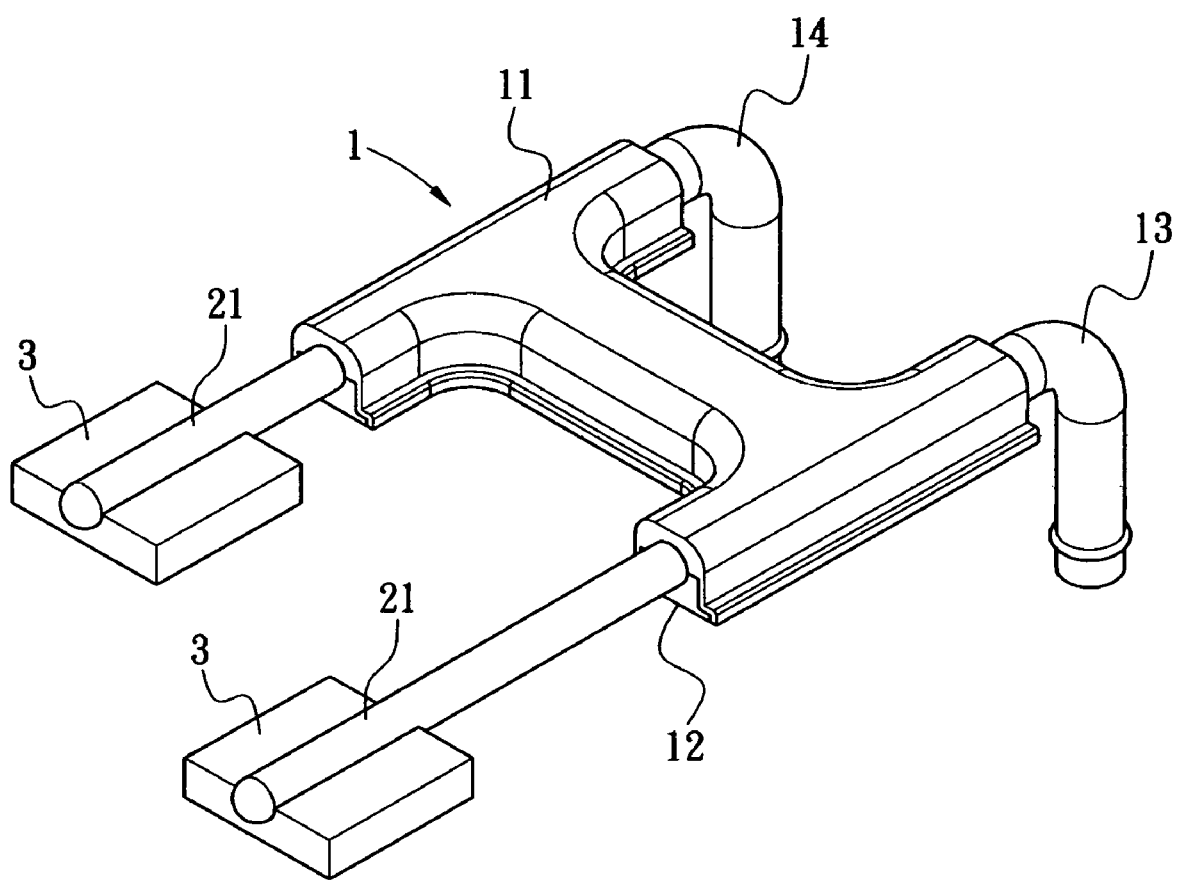
FIG. 2 is a schematic view showing the assembling of the present invention.
Figure 3:
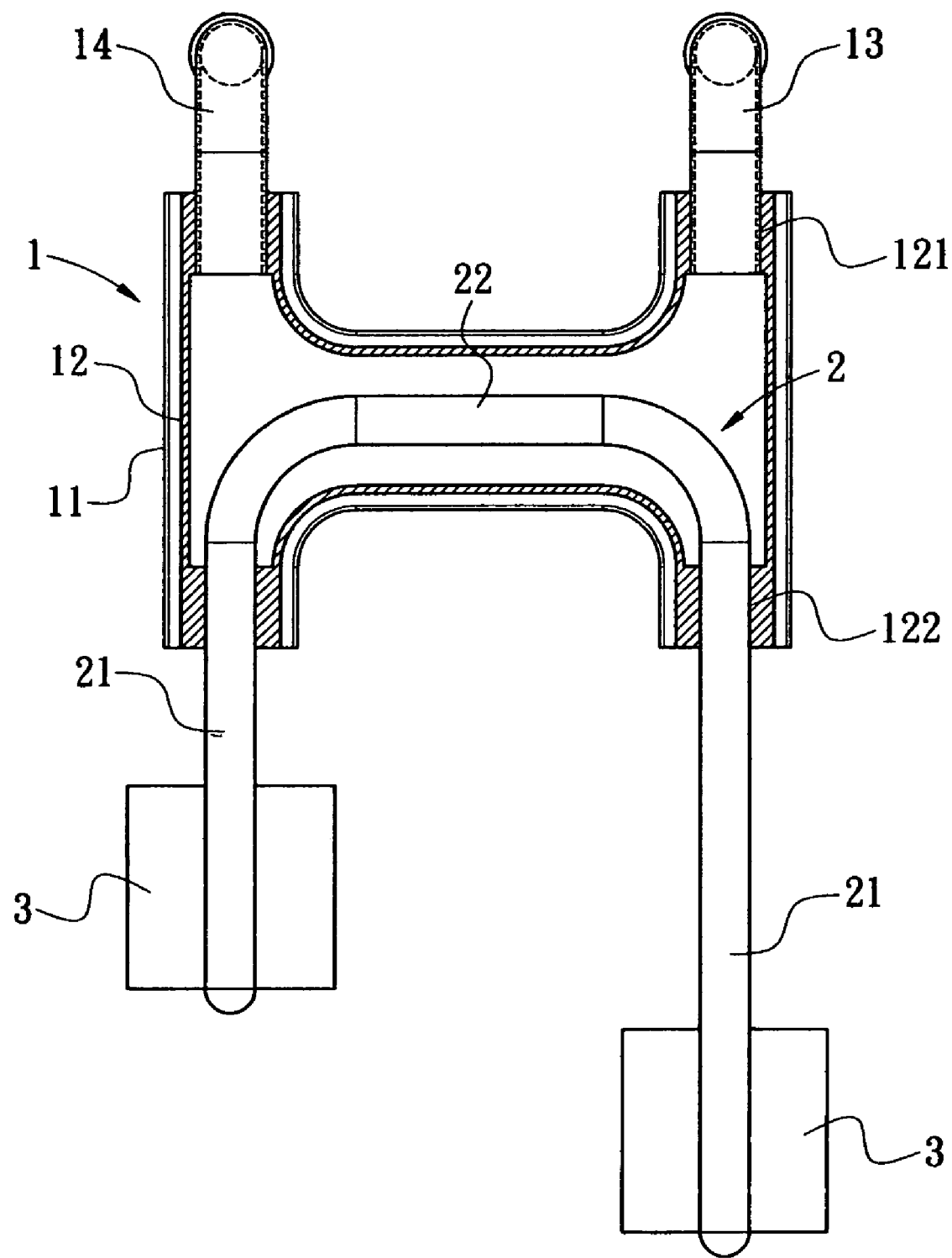
FIG. 3 is a cross-sectional view showing the assembling of the present invention.

FIG. 1 is an exploded perspective view of the present invention. FIG. 2 is a schematic view showing the assembling of the present invention. FIG. 3 is a cross-sectional view showing the assembling of the present invention. The present invention provides an improved structure of water-cooling heat dissipator comprising a water-cooling head member 1 and at least one heat pipe 2.

The water-cooling head member 1 is formed into H-shaped and includes a first cover 11 and a second cover 1a connected to the underside of the first cover 11. Both rear ends of the first cover 11 and the second cover 1a are formed with an upper receiving portion 111 and a lower receiving portion 121, respectively. The upper receiving portion 111 and the lower receiving portion 121 are formed into semi-circular for connecting to a water-draining conduit connector 13 and a water-injecting conduit connector 14, respectively. A channel portion 15 is formed between the first cover 11 and the second cover 12. A bottom of the upper receiving portion 111 is recessed into the first cover 11, and a bottom of the lower receiving portion 121 is recessed into the second cover 12. A main body of the upper receiving portion 111 projects from the first cover 11 and a main body of the lower receiving portion 121 projects from the second cover 12 The height of the channel portion 15 is identical to the inner diameter of the water-draining conduit connector 13 and the water-injecting conduit connector 14, so that the liquid flows very smoothly without producing any bubbles. Further, an upper clamping portion 112 and a lower clamping portion 122 are projected from both front ends of the first cover 11 and the second cover 12 to correspond to each other, respectively. The clamping portions 112 and 122 are formed into semi-circular.

Figure 5:
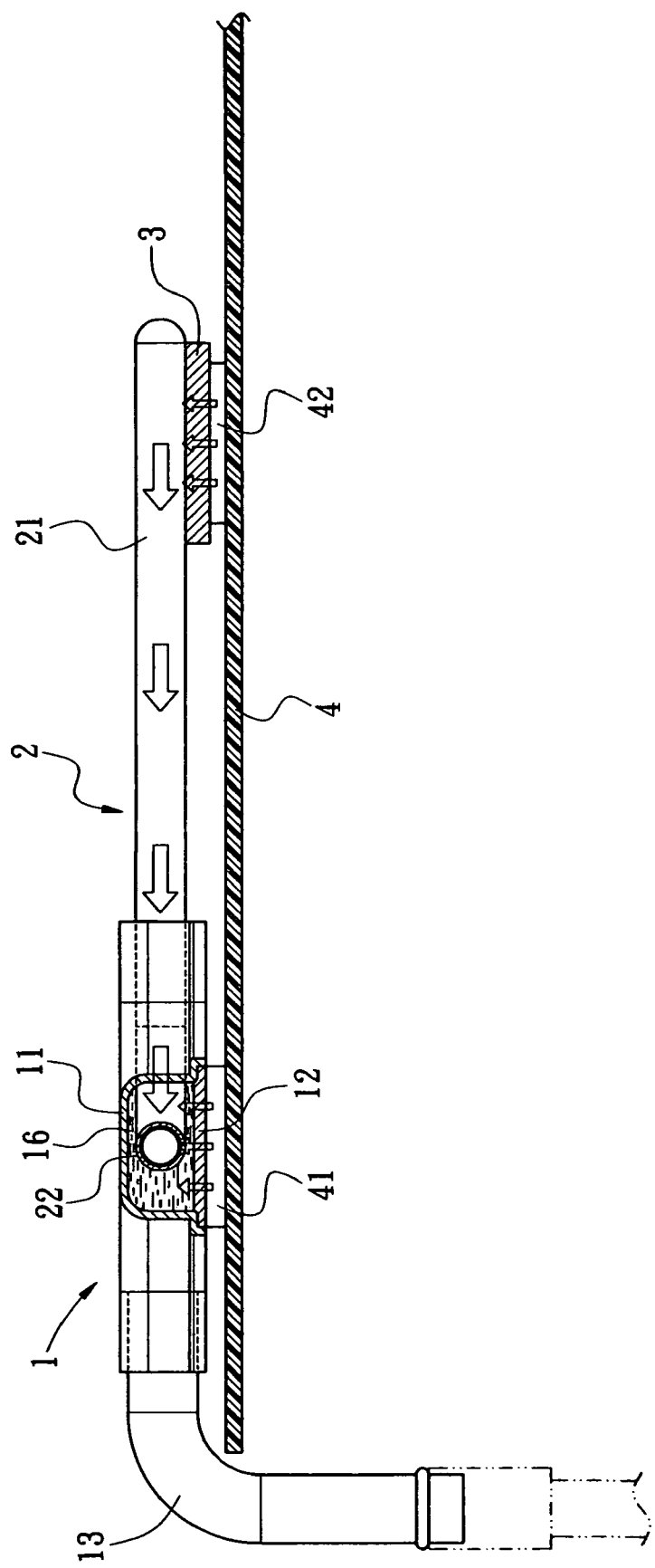
FIG. 5 is a cross-sectional view of FIG. 4.

The heat pipe 2 is formed into U-shaped. The interior of the heat pipe is provided with capillary constructions and the working fluid, and the exterior thereof is formed with a heat-absorbing portion 21 and a heat-radiating portion 22. The heat-radiating portion 22 is accommodated into the channel portion 14 of the water-cooling head member 1. The outer diameter of the heat pipe 2 is smaller than the height of the channel portion 14. When the heat pipe 2 is clamped to the upper clamping portion 112 and the lower clamping portion 122, a space 16 (as shown in FIG. 5) is formed between the outer wall of the heat pipe 2 and the inner walls of the first cover 11 and the second cover 12. The liquid can flow through the space 16 and thus the heat of the heat-radiating portion 22 of the heat pipe 2 can be rapidly carried away to rapidly condense the working fluid within the heat pipe into a liquid. The condensed liquid is then carried back to the heat-absorbing portion 21 of the heat pipe 2 by the capillary attraction of the capillary constructions, thereby to achieve a circulatory heat dissipation of the heat pipe. Further, the heat-absorbing portion 21 of the heat pipe 2 can be connected to a heat-conducting block 3. The heat-conducting block 3 is made of copper, aluminum or other materials having good heat conductivity. The heat-absorbing portion 21 is adapted to have a wider area for absorbing the heat, and is attached to the surface of the heat-generating element. In assembling, first, the solder paste or adhesive is coated on the surfaces of the upper receiving portion 111 and the upper clamping portion 112 of the first cover 11 and the lower receiving portion 121 and the lower clamping portion 122 of the second cover 12. Then, the water-draining conduit connector 13, the water-injecting conduit connector 14 and the heat pipe 2 are positioned on the lower receiving portion 121 and the lower clamping portion 122 of the second cover 12. The first cover 11 is correspondingly mounted on the upside of the second cover 12. After heating and baking, all the members can be tightly connected.

Figure 4:
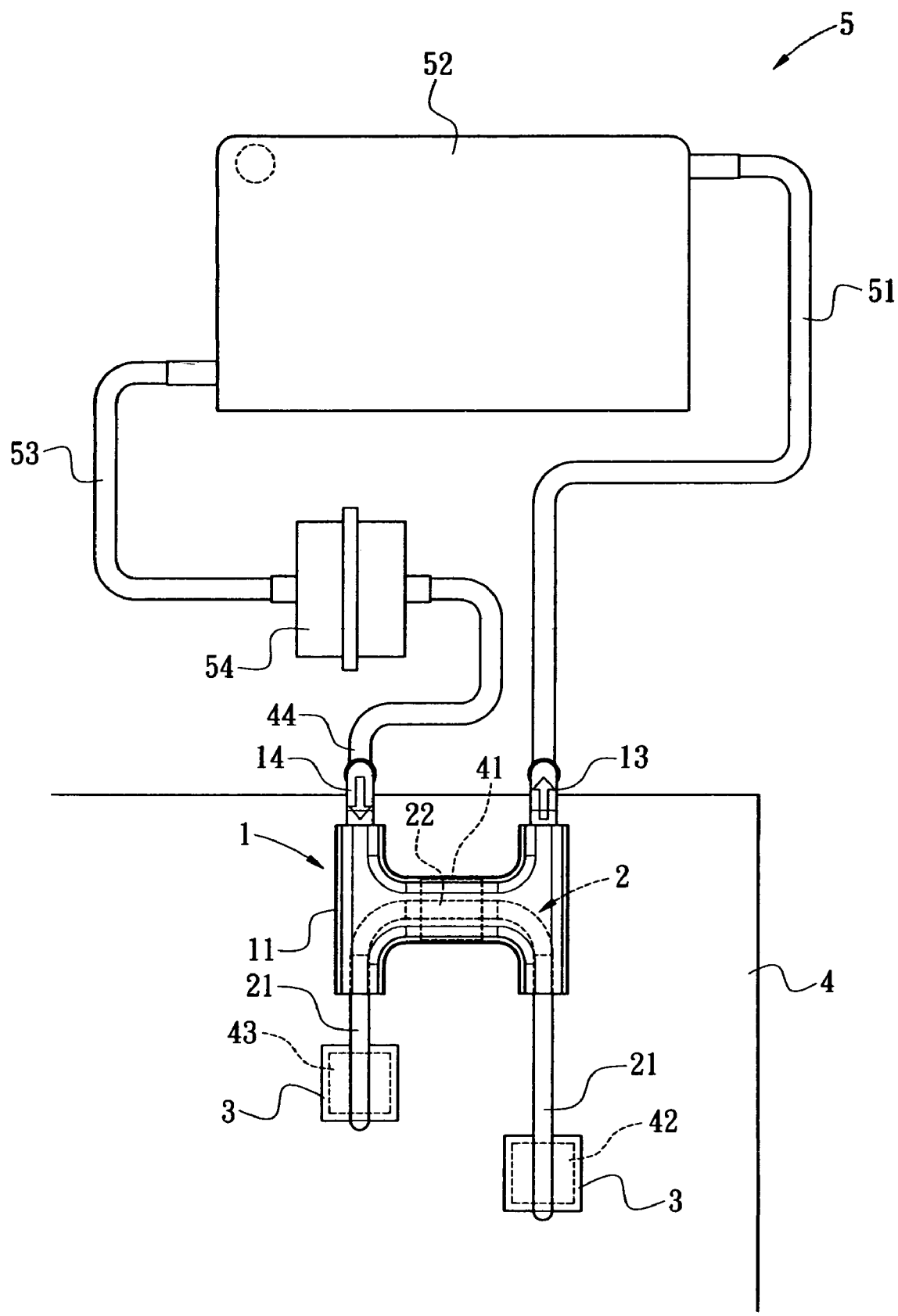
FIG. 4 is a schematic view showing the state in which the present invention is applied to a computer main board.

FIG. 4 is a schematic view showing the state in which the present invention is applied to a computer main board, and FIG. 5 is a cross-sectional view of FIG. 4. The water-cooling heat dissipator of the present invention can be applied to a computer main board 4. The computer main board 4 has a CPU 41, a memory controller hub 42, an I/O controller hub 43, a memory module, an interference card module and other electronic heat-generating elements having individual functions. The bottom face of the second cover 12 of the water-cooling head member 1 is coated with a heat-conducting medium (not shown) and then attached to the surface of the CPU 41. Each heat-conducting block 3 connected to the heat pipe 2 is attached to the top faces of the memory controller hub 42 and the I/O controller hub 43, respectively. The water-draining conduit connector 13 and the water-injecting conduit connector 14 of the water-cooling head member 1 are connected to a heat exchanger 5, respectively. The heat exchanger 5 comprises a first communicating conduit 51, a water-cooling row 52, a second communicating conduit 53, a pump 54 and a third communicating conduit 55. With the assembling of all members, a circulatory flowing loop for the liquid can be formed within each member to perform the heat dissipations of the electronic heat-generating elements such as the CPU 41, the memory controller hub 42 and the I/O controller hub 43.

Figure 6:
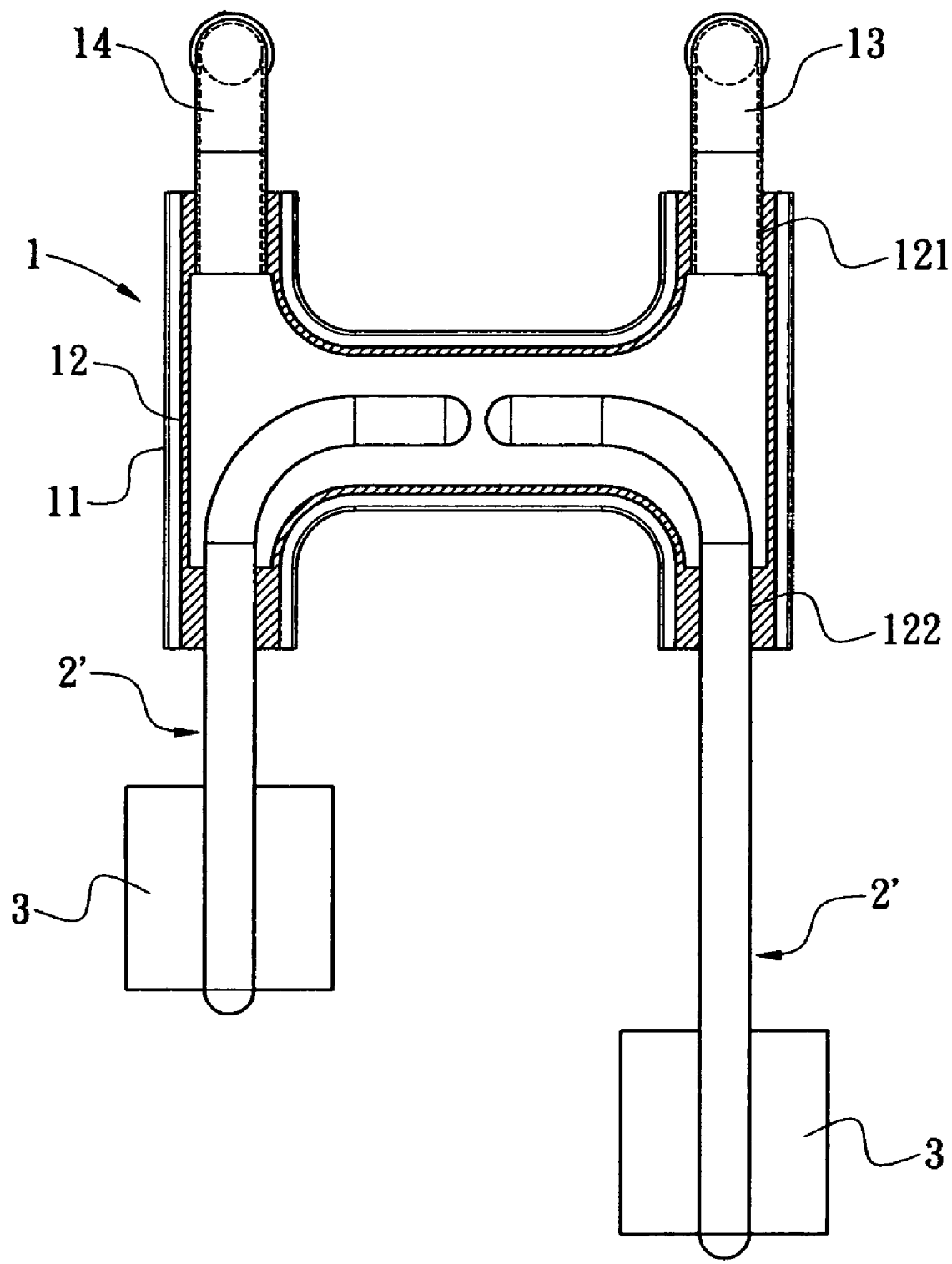
FIG. 6 is a cross-sectional view showing the assembling of another embodiment of the present invention.

FIG. 6 is a cross-sectional view showing the assembling of another embodiment of the present invention. In addition to the above embodiment, the heat pipe 2 of the present invention can be adapted to be formed by a single "L-shaped" or two "L-shaped" heat pipe 2' according to the practical need and arrangement. The present embodiment employs two "L-shaped" heat pipes. On end of each heat pipe 2' is provided with a heat-conducting block 3, respectively. Each heat-conducting block 3 is attached to the electronic heat-generating elements, so that the effect equivalent to the above embodiment can be obtained.

According to the above, the improved structure of water-cooling heat dissipator has the advantages as follows:

1. The water-cooling head member is simple in structure and only comprises the first cover, the second cover, the conduit connectors and the heat pipe. Gasket, screws and other fastening elements can be omitted to greatly reduce the cost.

2. The manufacturing and the assembling procedures are easy to operate. Only one processing operation is needed to finish the assembling of all members.

3. The conduit connectors are arranged parallel to the first cover and the second cover, so that the total height of the water-cooling head member can be reduced to the lowest value, which is suitable for the manufacturing and use of compact electronic devices.

4. The conduit connectors and the heat pipe can be clamped between the first cover and the second cover without any additional fixing or welding means. Further, the degree of tightness is greater than that of the products caused by general fixing means.

5. There is no drop between the inner wall of the conduit connectors and the height of the channel portion, so that the flowing of the fluid does not produce bubbles and the temporary stay of the liquid cannot occur.

According to the above, the improved structure of water-cooling heat dissipator of the present invent has industrial applicability, novelty and inventive steps. Further, since the construction of the present invention has not been published or put to public use prior to applying for patent, the present invention indeed conforms to the requirements for a utility model patent.

Although the present invention has been described with reference to the foregoing preferred embodiments, it will be understood that the invention is not limited to the details thereof. Various equivalent variations and modifications can still be occurred to those skilled in this art in view of the teachings of the present invention. Thus, all such variations and equivalent modifications are also embraced within the scope of the invention as defined in the appended claims.

What is claimed is:

1. A water-cooling heat dissipator, comprising:
   a water-cooling head member having a first cover and a second cover connected to the first cover, both ends of each cover formed with receiving portions correspondingly to each other, the receiving portions connected to conduit connectors, respectively, and a channel portion formed between the first cover and the second cover, the conduit connectors being in communication with the channel portion and the conduit connectors being configured for providing a liquid to the channel portion; and
   at least one heat pipe received in the channel portion of the water-cooling head member at one end thereof.

2. The water-cooling heat dissipator according to claim 1, wherein the water-cooling head member is formed into H-shaped.

3. The water-cooling heat dissipator according to claim 1, wherein the receiving portion comprises an upper receiving portion and a lower receiving portion, a bottom of the upper receiving portion is recessed into the first cover, and a bottom of the lower receiving portion is recessed into the second cover, so that the height of the channel portion is identical to the inner diameter of each conduit connector.

4. The water-cooling heat dissipator according to claim 3, wherein each receiving portion is formed into semi-circular.

5. The water-cooling heat dissipator according to claim 1, wherein the height of the channel portion is identical to the inner diameter of the conduit connectors.

6. The water-cooling heat dissipator according to claim 1, wherein the first cover and the second cover are provided at one side with a clamping portion corresponding to each other for connecting to the heat pipe.

7. The water-cooling heat dissipator according to claim 6, wherein the clamping portion comprises an upper clamping portion and a lower clamping portion, the upper clamping portion projects from the first cover, and the lower clamping portion projects from the second cover, so that a space is formed between the outer wall of the heat pipe and the inner walls of the first cover and the second cover.

8. The water-cooling heat dissipator according to claim 7, wherein each clamping portion is formed into semi-circular.

9. The water-cooling heat dissipator according to claim 1, wherein the heat pipe is formed into either L-shaped or U-shaped.

10. The water-cooling heat dissipator according to claim 1, further comprising a heat-conducting block connected to the other end of the heat pipe.

11. A water-cooling heat dissipator, comprising:

a water-cooling head member having a first cover and a second cover connected to the first cover, both ends of each cover formed with receiving portions correspondingly to each other, the receiving portions connected to conduit connectors, respectively, and a channel portion formed between the first cover and the second cover; and at least one heat pipe received in the channel portion of the water-cooling head member at one end thereof, wherein the receiving portion comprises an upper receiving portion and a lower receiving portion, a bottom of the upper receiving portion is recessed into the first cover, and a bottom of the lower receiving portion is recessed into the second cover, so that the height of the channel portion is identical to the inner diameter of each conduit connector.

12. The water-cooling heat dissipator according to claim 11, wherein each receiving portion is formed into semi-circular.

13. A water-cooling heat dissipator, comprising:

a water-cooling head member having a first cover and a second cover connected to the first cover, both ends of each cover formed with receiving portions correspondingly to each other, the receiving portions connected to conduit connectors, respectively, and a channel portion formed between the first cover and the second cover; and at least one heat pipe received in the channel portion of the water-cooling head member at one end thereof, wherein the height of the channel portion is identical to the inner diameter of the conduit connectors.

* * * * *